(12) United States Patent
Migatz et al.

(10) Patent No.: US 7,225,421 B2
(45) Date of Patent: May 29, 2007

(54) CLOCK TREE DISTRIBUTION GENERATION BY DETERMINING ALLOWED PLACEMENT REGIONS FOR CLOCKED ELEMENTS

(75) Inventors: William R. Migatz, Wappingers Falls, NY (US); Paul M. Campbell, Beacon, NY (US); David J. Hathaway, Underhill, VT (US); David S. Kung, Chappaqua, NY (US); Ruchir Puri, Baldwin Place, NY (US); Louise H. Trevillyan, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 10/905,970

(22) Filed: Jan. 28, 2005

(65) Prior Publication Data
US 2006/0190899 A1    Aug. 24, 2006

(51) Int. Cl.
*G06F 17/50*    (2006.01)
(52) U.S. Cl. .......................... 716/13; 716/11; 716/12; 716/14
(58) Field of Classification Search .................. 716/11, 716/12, 13, 14, 10
See application file for complete search history.

(56) References Cited

U.S. PATENT DOCUMENTS

| | | | | |
|---|---|---|---|---|
| 5,963,728 A * | 10/1999 | Hathaway et al. | ............. | 716/3 |
| 6,182,271 B1 * | 1/2001 | Yahagi | ................ | 716/10 |
| 6,205,571 B1 * | 3/2001 | Camporese et al. | ........... | 716/2 |
| 6,536,024 B1 * | 3/2003 | Hathaway | ................ | 716/6 |
| 6,651,224 B1 * | 11/2003 | Sano et al. | .................... | 716/2 |
| 2003/0182649 A1 * | 9/2003 | Harn | ............... | 716/11 |

* cited by examiner

*Primary Examiner*—Sun James Lin
(74) *Attorney, Agent, or Firm*—H. Daniel Schnurmann

(57) ABSTRACT

A method, system and program product are described for generating a clock distribution network on an integrated circuit by determining an allowable placement region for each of a set of clock tree leaf elements in the integrated circuit. This allowable placement region is generated by determining and intersecting a set of sub-regions under different constraints, each of which identifies an area in which the clock tree leaf element is placed to satisfy the respective constraint. Constraints for which sub-regions are determined include timing constraints in the form of slacks and congestion constraints. After allowable placement regions have been determined, the clock tree leaf elements are clustered, and each clock tree leaf element is placed at a location within its allowable placement region which minimizes some cost function for that clustering.

24 Claims, 13 Drawing Sheets

CLOCK TREE DISTRIBUTION GENERATION BY DETERMINING ALLOWED PLACEMENT REGIONS FOR CLOCKED ELEMENTS

BACKGROUND OF THE INVENTION

This invention is related to the field of Design Automation of Very Large Scale Integrated (VLSI) circuit chips, and more particularly, to the determination of allowed placement regions within the chip for clocked elements in a design.

It is known in the art that clock tree generation is intended to create an electrical network to distribute a clock signal to clocked elements for use as a sequencing control for logical operations within a chip. A common type of clock distribution network is a buffered clock tree for which the clock tree generation determines how many clock buffers are needed, how they are to be connected, both to clocked circuit elements at the leaves of the clock tree and to other buffers at upper levels of the clock tree (i.e., levels closer to the root of the tree), and where they are to be placed. Practitioners in the art will fully recognize that a clock buffer in the present context may include any circuit that propagates a clock signal, specifically including inverting and non-inverting buffers, clock splitting, shaping circuits, clock gating circuits, and the like. Specific objectives of clock tree generation are to place clock buffers so that particular load and slew constraints for each net and sink in the clock tree are met that generate a clock tree in which the relative signal arrival times at clock tree leaf elements are as close as possible to the desired target (often this target is to have all sink arrival times coincide in order to achieve zero skew), and to achieve all these objectives with the minimum possible wiring resource usage, the minimum possible number of clock buffers, and the minimum possible root to leaves clock tree delay. It will be understood by those skilled in the art that the term clock tree leaf element in the present context refers to any circuit which is synchronized to a clock signal, and may include latches, flip-flops, and/or other memory elements. Clock tree leaf elements and clock buffers will collectively be referred to as clocked elements.

Typical methods of clock tree generation assume that the locations for clock tree leaf elements are fixed, having been previously determined by a placement program or other means, wherein the clock tree leaf elements do not move during the clock tree generation. However, it is desirable to cause clocked elements driven by a single net to be placed in close physical proximity in order to reduce the amount of wiring at the leaf level of the tree which typically accounts for most clock wiring. Because clock signals are typically the most frequently switching signals on an integrated circuit, reducing the wiring also limits the clock net capacitance which must be driven, and hence reduces power consumption, because the switching power consumed by a net on an integrated circuit is roughly proportional to the net capacitance times the switching frequency of the net. Such clustering also allows the clock buffers which control the clock tree leaf elements to drive a larger number of these elements without violating constraints (e.g., buffer load, slew, and the like). As a result, the number of clock buffers that are required is reduced, resulting in additional power reduction, with a similar benefit seen up to the root of the clock tree.

Although the term timing slack, hereinafter referred to slack, is commonly used to refer to results of computations performed in either early or late mode timing analysis, in the present context, slack will relate to late mode timing analysis. A slack at a point in an integrated circuit (e.g., a circuit element input pin) will refer to the amount by which a signal arrives at that point earlier than is required for a correct circuit operation. Thus, a negative slack indicates that a signal arrives too late, and the normal constraint on the slack is that it be greater than or equal to zero. Typically, a slack is computed as the difference between a required arrival time (RAT) at a point and an arrival time (AT) at the same point. The late mode AT of a point is an upper bound on the time at which the signal at the point will become stable and is computed by well-known forward propagation methods. The late mode RAT of a point is a lower bound on the time at which the signal at that point will be required to become stable in order to meet timing requirements, and is computed using well-known backward propagation methods. The late mode RAT at the data input of a storage element is typically computed from a setup time requirement between the data and clock for the storage element and the early mode clock AT of the storage element.

The concept of slack will now be illustrated with reference to FIG. 1. Latch 100 launches data on clock edge 150 which occurs at time zero, and a signal propagates therefrom to latch 140 through net 110, logic network 120 (any collection of interconnected logic gates), and net 130. The resulting signal is captured at latch 140 by clock edge 160 occurring one clock cycle later than clock edge 150. The cumulative delay from latch 100 to latch 140 is 0.2 ns+3.5 ns+0.3 ns, or 4.0 ns, which is also the AT of the data input of latch 140. If the setup time requirement at latch 140 is zero (i.e., the data input cannot arrive any later than the clock, but need not arrive earlier) and the clock cycle is 4.0 ns, the RAT of the data input of latch 140 is 4.0 ns, and the slack of the data input is 4.0 ns−4.0 ns, or 0.0 ns. The same cumulative delay is subtracted from the input of latch 140 RAT to produce a RAT of 0.0 ns at the output of latch 100; thus, the slack thereof is 0.0 ns−0.0 ns, or 0.0 ns. The fact that the slack at the input of latch 100 and the output of latch 140 are the same is not accidental; the slack at all points along any critical path (i.e., a path which imposes the most stringent timing requirements on all points along it) will always be the same. Had the cumulative delay of the path from 100 to 140 been greater or had the clock cycle been smaller, the slack would have been negative. Likewise, if the cumulative delay of the path from 100 to 140 had been smaller or if the clock cycle had been greater, the slack would have been positive. One way in which the cumulative delay can change is by increasing or decreasing the wire length of either net 110 or net 130, thereby changing the wire delay and capacitive load. Such change in wire length occurs by moving either latch 100 or 140, thus altering the distance between the moved latch and the logic gate in logic network 120 to which it is connected. Note that the situation in FIG. 1 is simplified, since there exist multiple paths from a typical storage element to other storage elements and multiple paths from other storage elements thereto. FIG. 1 also shows positive edge-triggered latches or flip-flops. The description can be extended to other commonly known types of clock tree leaf elements such as negative edge-triggered latches, master slave latches, and memory arrays.

One prior art method of clock tree generation which provides for clocked element movement is described in U.S. Pat. No. 6,609,228 to Bergeron et al. Therein is described the formation of logical clusters of clock tree leaf elements, (sets of clock tree leaf elements to be driven by a common clock net), and then adjustment of the location of the clocked elements in the cluster to reduce the amount of wire required in the net driving them. Movement of clock tree leaf elements may alter the timing of a circuit due to changes in wire length and, hence, changes in wire delay and capacitive load. These changes can cause violations of timing requirements to occur by making the slacks exceed a specified limit. Movement of clocked elements may also cause the number of circuits placed or the number of wires routed in a local region to exceed the capacity of that region, a condition known as placement or wiring congestion.

Clock tree leaf elements are often larger than clock buffers. Because each clock buffer drives many other clocked elements (clock buffers at upper levels of the clock tree or clock tree leaf elements at the leaves of the clock tree), the number of clock tree leaf elements is much larger than the number of clock buffers. Thus, the potential congestion caused by the movement of clock tree leaf elements generally exceeds that which results from the movement of clock buffers. However, Bergeron et al. do not describe using slacks or other forms of timing information to control the movement of clocked elements, nor do they describe the use of congestion information to control the movement of clocked elements.

Attempts have been made in the art to place clock buffers within a clock tree and to generate allowed placement regions for clock buffers in a buffered clock tree. These attempts are based on timing information such as capacitance, delay, and slew. Specifically, the placement region for a clock buffer is the area within which the clock buffers are placed without violating capacitance, delay or slew constraints. Such attempts, however, have not been applied to clock tree leaf elements, and present a distinct disadvantage in that they are not formed based on slack constraints and intersecting sub-regions.

SUMMARY AND OBJECTS OF THE INVENTION

Accordingly, it is an object of the invention to determine allowable placement regions for clock tree leaf elements, such as latches and the like, in the design of an integrated circuit chip.

It is another object of the invention to cluster the clock tree leaf elements into nets based on these allowable placement regions so as to minimize a cost function.

It is a further object of the invention to determine final placement locations for clock tree leaf elements within their respective allowable placement regions so as to minimize the cost function.

In a first aspect of the invention, the allowable placement region for the clocked element is determined by the intersection of more than one allowable placement sub-region, wherein each intersected allowable placement sub-region is related to some constraint placed on the clocked element. The intersected allowable placement sub-regions include:

a) one sub-region for each connection of the clocked element within which the clocked element can be placed so that the timing requirements between the clocked element and its respective connections are satisfied and, if they cannot be satisfied, then, at least within which they are not worse; and b) a sub-region which avoids placing the clocked element at a location which causes one or more of the local circuit, wiring, and power densities to exceed certain predetermined limits.

The sub-regions determined above in (a) are typically (but not exclusively) shaped as diamonds having 90° angles, (since all the points on the periphery of such a diamond are equidistant from the center in a Manhattan space, i.e., along paths composed solely of horizontal and vertical segments). The sub-regions in (b) have arbitrary shapes because the circuit and the wiring densities vary arbitrarily (i.e., the densities are not solely related to the placement of the clocked elements). The intersections of category (a) sub-regions tend to result in quadrilaterals (intersection of diamonds having 90° angles). Since category (b) sub-regions are arbitrary shaped, intersections with these sub-regions result in regions having arbitrary shapes. The cell is restricted to a certain area due to placement constraints (i.e., moving bounds) and is not covered by this invention. Additionally, areas may exist where it cannot be placed due to the existence of blockages (typically cells whose locations are fixed and cannot be changed).

Once the allowed placement regions for the clocked elements are established, they are instrumental in determining the clustering of the clocked elements to nets driven by clock driving elements. The clocked elements are then clustered to nets, each moving to a point in its allowed placement region such that the amount of wire for that net is minimized or that best satisfies any other stated goal of the clock tree construction. It is this movement that results in reducing the power consumption.

In another aspect of the invention, there is provided a method of generating a clock distribution network on an integrated circuit that includes the steps of:

a) determining an allowable placement region for each of the clock tree leaf elements;

b) grouping each of the clock tree leaf elements into a cluster; and c) placing each clock tree leaf element at a location within its allowable placement region, such that a cost function is minimized.

BRIEF DESCRIPTION OF THE DRAWINGS

The accompanying drawings, which are incorporated in and which constitute part of the specification, illustrate presently preferred embodiments of the invention which, together with the general description given above and the detailed description of the preferred embodiments given below serve to explain the principles of the invention.

DETAILED DESCRIPTION

Figure 1:
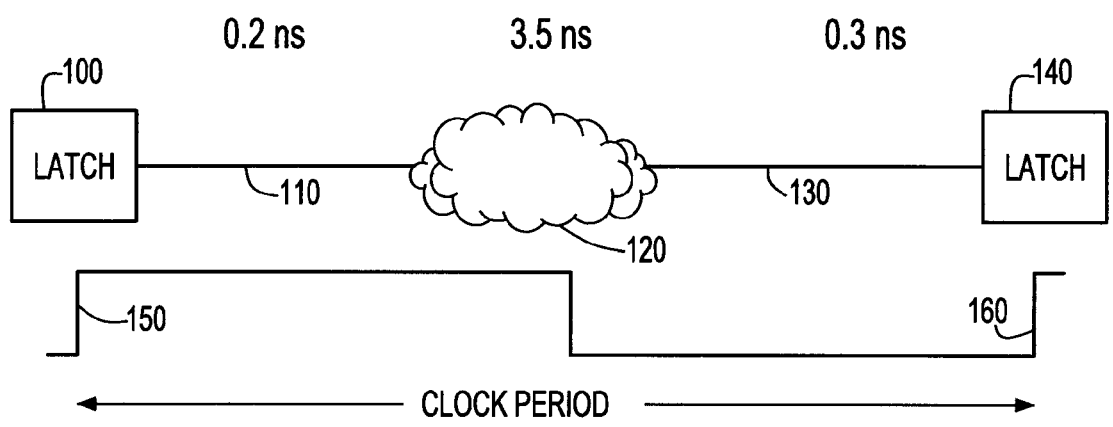
FIG. 1 illustrates the concept of a conventional slack.
Figure 2:
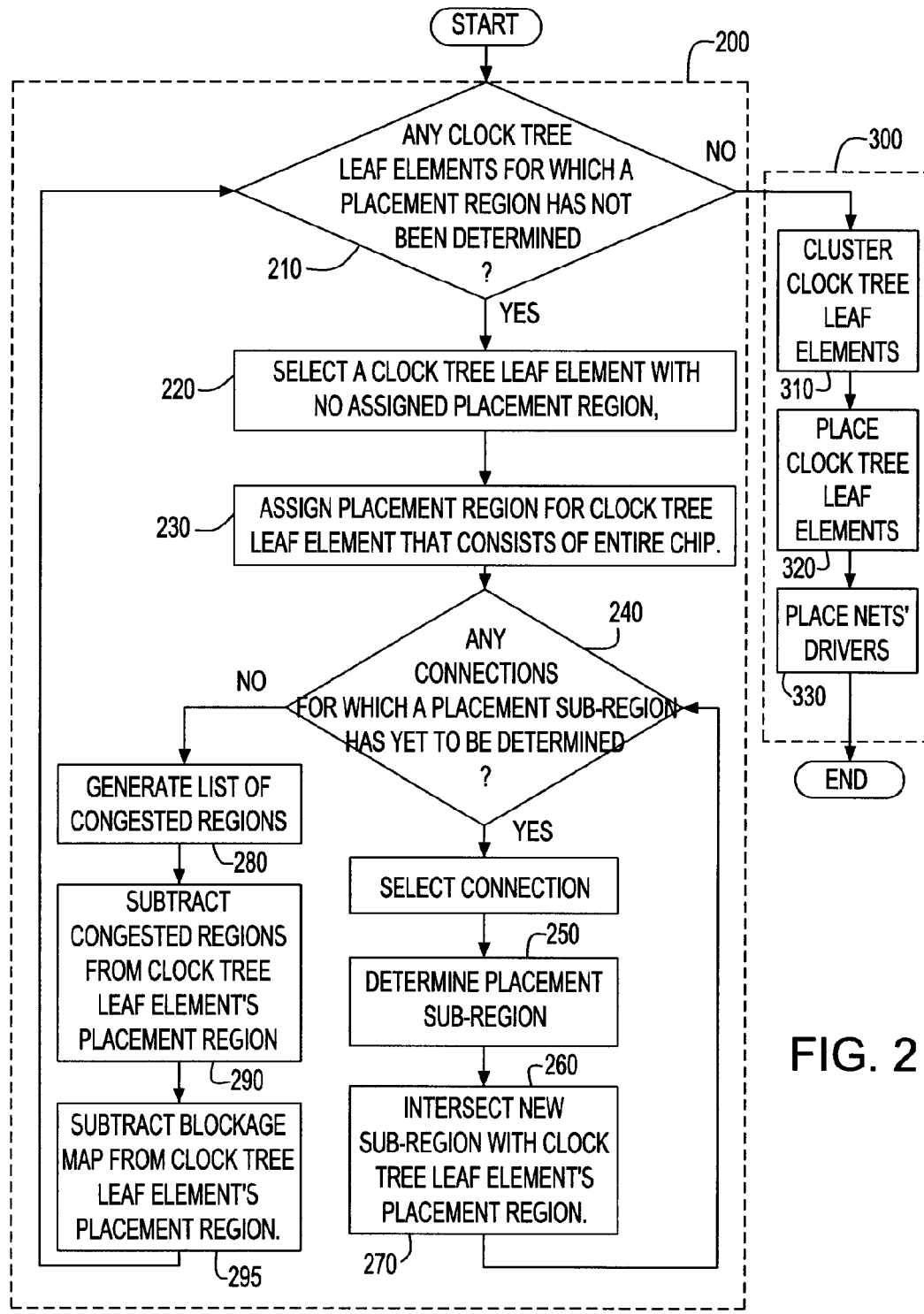
FIG. 2 is a flow chart that illustrates a preferred embodiment of the present invention.

Referring now to FIG. 2, there is shown a flow chart that illustrates the various method steps of the present invention. The basic algorithm consists of two major steps represented by blocks 200 and 300.

In step 200, a placement region for each clock tree leaf elements is first determined. This is accomplished by assigning an initial placement region, and repeatedly reducing it by intersecting it with sub-regions formed to account for the various constraints on the placement of the clock tree leaf element. The intersection is determined by finding an overlap of two or more regions. In some circumstances, there may be no location which satisfies all the constraints on the clock tree leaf element. To ensure that at least one legal location is found, the original location of the clock tree leaf element is normally included in all the intersected regions, though it may optionally be excluded if the intersection of all sub-regions is not empty and does not include the original clock tree leaf element location.

In step 300, clustering of the clock tree leaf elements into groups is performed. The members of each group are driven by a common clock net. If multiple clock distribution networks are generated in parallel (e.g., for multi-phase or differential clocking), then all the members of the group will be driven by a common set of clock nets. Also in step 300, the final locations of the clock tree leaf elements and of the clock buffers driving each of these groups is determined.

Considering step 200 in more detail, it is first determined in step 210 whether there are any clock tree leaf elements for which a placement region has not yet been determined. At the start of the execution of the inventive method, all the clock tree leaf elements reside in this category. If the answer is negative, the method proceeds to step 300. Otherwise, it branches to step 220, wherein a clock tree leaf element is selected for which a placement region has not yet been determined. Continuing to step 230, an initial placement region is assigned to the selected clock tree leaf element. Typically, it encompasses the entire area of the chip, and is reduced in subsequent steps by way of intersections with sub-regions. Alternatively, the initial placement region consists of only portions of the chip area which will not otherwise be subsequently removed in step 290 due to blockages from large fixed objects or in step 280 due to congestion. However, in the preferred embodiment, the reduction due to blockage and congestion in the selected clock tree leaf element placement region is advantageously deferred until it has been reduced on account of other considerations. This is true because at that point only blockage or congested areas which are still part of the placement region need be considered, reducing the required computation time and the memory needed to store the boundaries of the blocked and congested areas.

Proceeding to step 240, a determination is made whether any connections of the clock tree leaf elements (i.e., any of its inputs or outputs) exist for which a placement sub-region has not yet been determined. In the present embodiment, a connection of the clock tree leaf element is the location of another circuit driving the clock tree leaf element or the location of another circuit being driven by it. Connections of the clock inputs for which the current click distribution network is generated are not included. For example, a flip-flop having a clock input, a data input driven by an output pin of cell X and a data output driving a net connected to the input pins of cells Y and Z will have connections at the output pin of X and at the input pins of Y and Z. If in step 240 it is ascertained that connections exist for which a placement sub-region is not determined, the method proceeds to step 250 wherein one of the connections is selected. The method then continues with step 260 at which a sub-region for the connections is established.

One type of allowable placement sub-regions in step 260 of FIG. 2 is determined on the basis of the connection of the clock tree leaf element (i.e., a circuit driven by or driving the clock tree leaf element) and by determining how far from the connection the clock tree leaf element can be placed without violating timing constraints. This is achieved by finding the maximum distance the clock tree leaf element can be placed from the circuit it is connected to without causing the initial negative slack to become worse, or causing the initial positive slack to become less than one-half its initial value (i.e., without using more than half the margin in the constraint if it is not initially violated, or without making it worse if it is). The reason for allowing only half the margin to be consumed by movement of the clock tree leaf element is that a timing path typically involves a movable clock tree leaf element at both ends thereof. Thus, it is advisable that the constraint margin is not used twice. It is understood that in some situations it is desirable to ensure that slacks remain greater than some positive threshold, or alternatively, that the target cycle time of the chip be set artificially low to ensure an adequate margin at the intended operational cycle time. In this case, a value of slack minus slack threshold (i.e., the slack excess over the threshold) is advantageously used instead of the slack itself, and the slack is reduced by up to one-half this value due to the movement of the clock tree leaf element.

Figure 13:
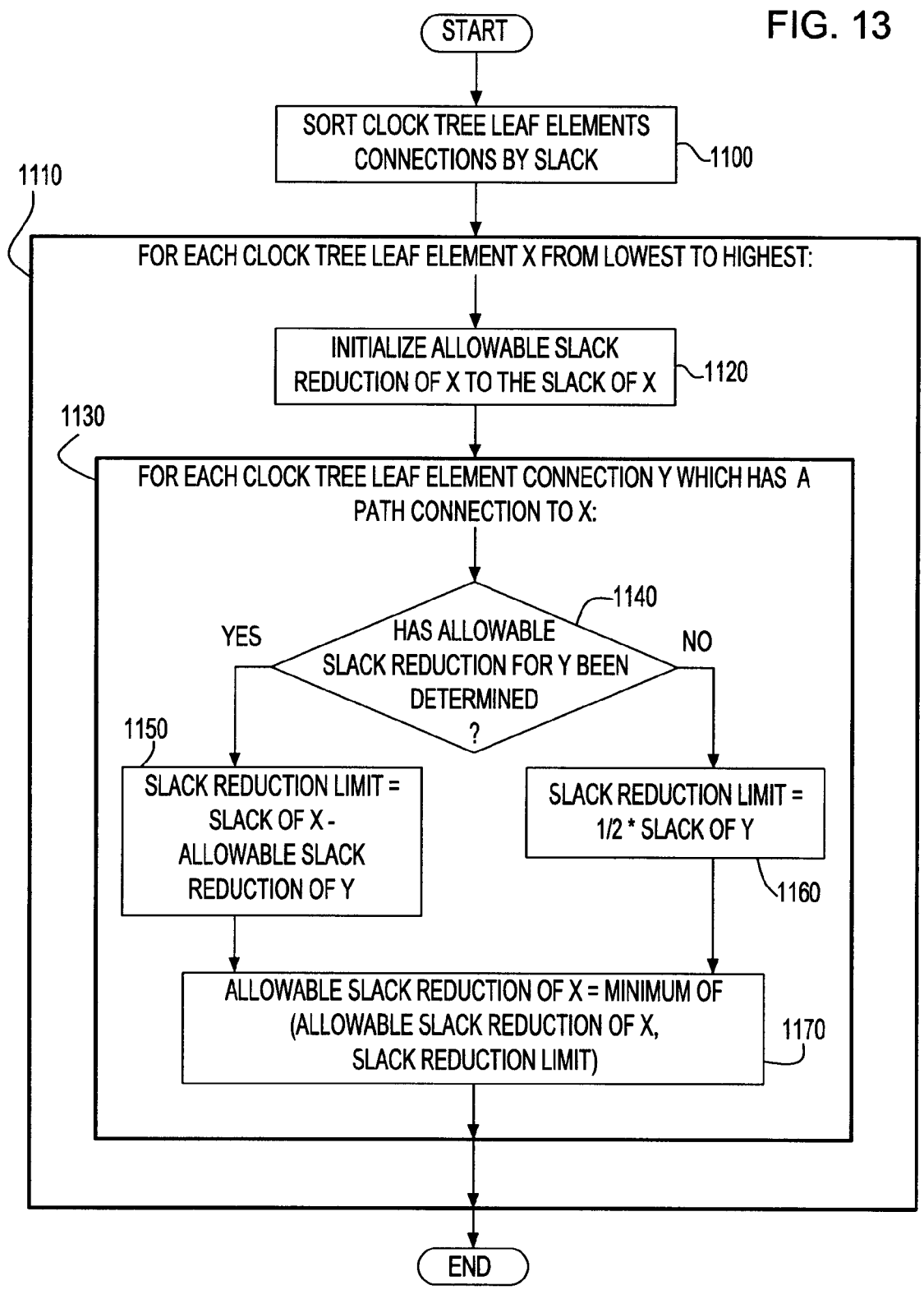
FIG. 13 is a flow chart that illustrates an alternative method for determining the allowable slack reduction for each clock tree leaf element connection

More sophisticated methods exist to determine compatible changes in slack and corresponding allowable placement regions for all the clock tree leaf elements which do not allow any constraint to be violated. One such method for determining the allowable slack reduction of each clock tree leaf element connection (and hence the distance the clock tree leaf element can be moved from that connection within any allowable placement region) is illustrated in FIG. 13. In step 1100, all the connections of the clock tree leaf elements are sorted according to their slack. As stated above, if a positive slack threshold has been specified, a value of the slack minus that positive slack threshold may be preferably used instead of the slack itself. In step 1110, each of these sorted connections X is considered, from the smallest slack to the largest. Within step 1110, step 1120 initializes the allowable slack reduction of X to the slack of X. Step 1130 then considers each connection Y that appears on a path involving X. For an input connection X of the clock tree leaf element, the path in question extends from the Y to X. For an output connection of the clock tree leaf element X, the path under consideration extends from the X to Y. The connections Y considered in step 1130 includes those to other clock tree leaf elements and also connections to other path endpoints, such as primary inputs or outputs of the chip. The allowable slack reduction for such non-clock tree leaf element connections are treated as having already been determined, and take the value zero. Within step 1130, step 1140 queries whether an allowable slack reduction for Y has already been determined. If it has, the method proceeds to step 1150. Otherwise, it branches to step 1160. In step 1150, a slack reduction limit is set to the slack of X minus the allowable slack reduction of Y already determined, which means that the slack of connection X can be reduced by whatever amount it is not already allocated to connection Y. In step 1160, the slack reduction limit is set instead to one-half the slack of Y, which means that at least half of the slack of Y is reserved for slack reduction at Y, and hence the slack of X is reduced by only the remaining or unallocated one-half the slack of Y. After performing either step 1150 or step 1160, the method proceeds to step 1170 in which the allowable slack reduction of X is set to the minimum of its current value and the slack reduction limit just computed. In this manner, an allowable slack reduction for each clock tree leaf element can be determined.

Figure 14:
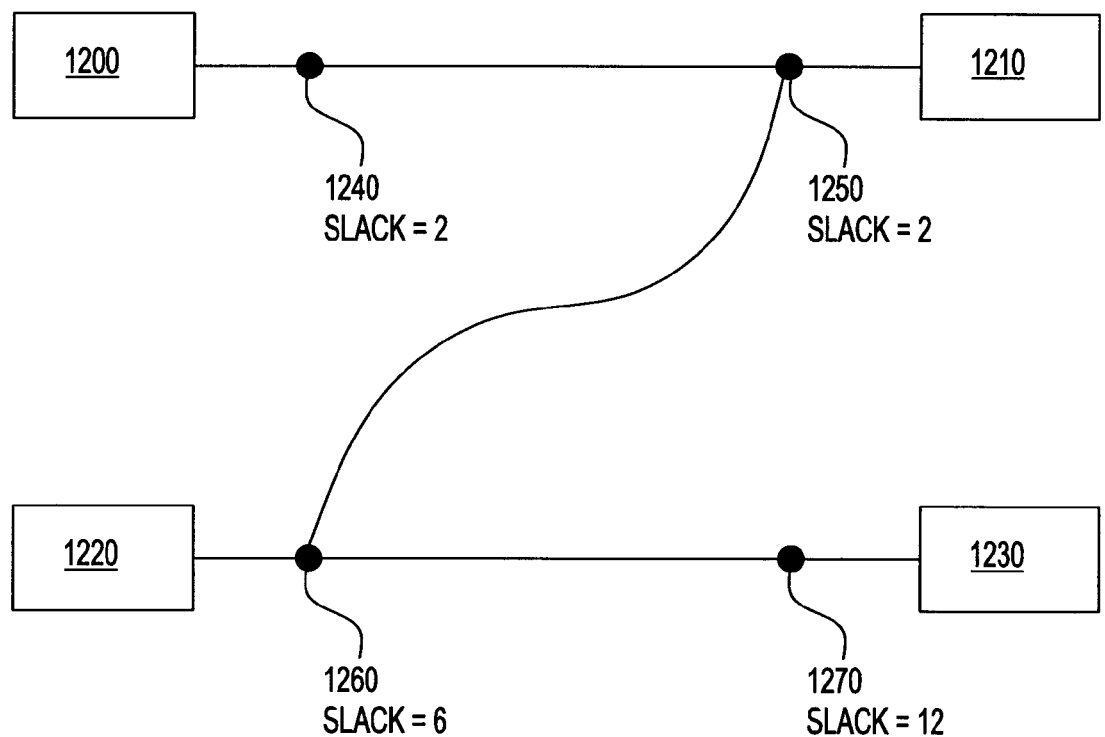
FIG. 14 is an example illustrating the application of the method as described with reference of FIG. 13.

FIG. 14 is an illustrative example to which the method of FIG. 13 can be applied. Clock tree leaf elements 1200, 1210, 1220, and 1230 are provided having connections 1240, 1250, 1260, and 1270, respectively. Connection 1240 has a slack of 2 as well as a path to connection 1250. Connection 1250, likewise, has a slack of 2 and paths to connections 1240 and 1260. Connection 1260 has a slack of 6 and paths to connections 1250 and 1270. Connection 1270 has a slack of 12 and a path to connection 1260. The sorted order of the connections resulting from step 1100, from smallest to largest slack, is 1240, 1250, 1260, and 1270. Note that because the slacks coincide, the order of connections 1240 and 1250 may be reversed. In step 1120 of major step 1110, the allowable slack threshold of connection 1240 is initialized to 2, which is also its slack. In step 1130 of major step 1110, the path connecting 1240 and 1250 is considered, and in step 1140 it is found that the allowable slack threshold of 1250 has not yet been determined. The flow proceeds to step 1160 where the slack reduction limit is set to 1, which is half the slack of 1250. In step 1170, the allowable slack threshold of 1240 is set to a slack reduction limit 1, since it is less than its previously initialized value of 2. The algorithm then applies the sub-steps of step 1110 to elements of the sorted list of connections, resulting in the following allowable slack reductions (ASRs):

ASR(1240)=min{Slack(1240), ½ Slack(1250)}=1

ASR(1250)=min{Slack(1250), Slack(1250)−ASR (1240), ½ Slack(1260)}=1

ASR(1260)=min{Slack(1260), Slack(1260)−ASR (1250), ½ Slack(1270)}=5

ASR(1270)=min{Slack(1270), Slack(1270)−ASR (1260)}=7

Note that ASRs of 1260 and 1270 are each greater than one-half their respective slacks, and thus the method of FIG. 13 is an improvement over the simpler method of limiting the slack reduction of a connection by one-half its slack.

The distance from the connection wherein a clock tree leaf element is placed is based on the added RC (resistance x capacitance) delay incurred as the distance between the clock tree leaf element and its connection increases. If the drive strength of the source of the net between the clock tree leaf element and its connection cannot increase in order to compensate, then, an additional delay is created by the increased capacitive load as the wire length and capacitance increase. For an input of the clock tree leaf element, the source of the net is the connection (i.e., the circuit driving the clock tree leaf element). For an output of a clock tree leaf element, the source of the net is the clock tree leaf element itself.

In a typical integrated circuit, the wiring is routed horizontally and vertically (also referred to as rectilinear routing). Because a diamond is the locus of points equidistant from the central point of a rectilinear routing environment (a "circle"), the placement sub-regions generated in this manner are diamonds with centers at the location of the connection of the clock tree leaf element. In the case of a negative connection slack, the diamond has a radius equal to the current distance from the clock tree leaf element to the source or sink cell. This indicates that the clock tree leaf element may not move farther from its critical connection than it was originally. In the case of a positive connection, the slack of the diamond radius is calculated by way of the use of delay equations or through a binary search.

In one method of finding the maximum distance from the connection at which the clock tree leaf element is to be placed (i.e., the diamond radius), the maximum allowable delay between the clock tree leaf element and the cell that drives it or is driven by is first determined. If the slack of the connection is negative, the maximum allowable delay is the original delay between the clock tree leaf element and its connection (i.e., the delay when the clock tree leaf element is at its original location), that is, the negative slack may not be made worse and the delay may not be increased. If the slack of the connection is positive, the maximum allowable delay between the clock tree leaf element and its connection is the original delay between them plus one-half the slack or, alternatively, the allowable slack reduction, as determined by the method of FIG. 13. In both instances, the original delay must include both the RC delay of the net and the contribution to the source delay of capacitive load of the wire between the clock tree leaf element and the connection. Once the maximum allowable delay has been determined, the diamond radius is the distance that results in that delay.

A technique for finding the diamond radius is to solve a delay equation. This can be demonstrated by way of example using a simplified delay equation. The delay of the source cell is estimated as being linear with respect to the load and, hence, to the wire length. Since the delay of the wire depends on the resistance and the capacitance, and since they both vary linearly with the distance, the wire (RC) delay varies quadratically with distance. The following equations show how to calculate the maximum radius of the diamond. Other more complex analytic delay equations can be used and solved for a distance d in a similar manner.

$$D_g = D_{int} + D_{gl} * C_l * d$$

$$D_{rc} = \alpha R_l C_l d^2 * \beta R_l C_l d$$

$$D_{total} = D_{max} = (\alpha R_l C_l) d^2 + (D_{gl} C_l + \beta R_l C_l) d + D_{int}$$

where:
$D_g$ is the gate (cell) delay
$D_{int}$ is the intrinsic delay of the gate (delay with zero load),
$D_{gl}$ is the additional gate delay per unit of load capacitance,
d is the diamond radius (the distance to be solved for),
$R_l$ is the resistance per unit length,
$C_l$ is the capacitance per unit length,
$D_{rc}$ is the delay due to wire resistance and capacitance,
$\alpha$ and $\beta$ are constants,
$D_{total}$ is the gate and RC delay, and
$D_{max}$ is the maximum allowed delay (as described above).

In the final equation, all values except for d are known. Since this is a quadratic equation, d can easily be determined.

In the event where an analytic delay equation is not used, or is not easily solved for d, a well-known binary search method is advantageously used to find the diamond radius. In this case, the clock tree leaf element is placed at some distance from its connection (perhaps determined by solving for d using a simplified or approximate delay equation) and the actual delay is then determined. If the delay is greater than the maximum allowable delay, then the clock tree leaf element is moved closer to the connection. If the delay is less than the maximum delay, it is then moved farther away from the connection. Once bounds are established (i.e., one position resulting in a delay greater than the maximum allowable delay and another in a delay less than the maximum), then, a point between the bounds is chosen. This point is either the midpoint of the bounds or it is computed using an interpolation between the bounding points to estimate the point at which the maximum allowable delay occurs. The delay at the new point is then computed, giving a new tighter bound which replaces one of the previous bounds, and the process is repeated until the computed delay is sufficiently close to the desired maximum delay or until some iteration limit is reached. This technique of selecting points by way of a binary search to find the distance will hereinafter be referred to as sampling.

In the case of nets with more than two pins, the correct shape of the allowable placement sub-region associated with a particular clock tree leaf element (i.e., the shape of the sub-region along whose bounds the connection delay equals the desired maximum allowable delay) is not a diamond. This occurs because of interactions and sharing between the wiring to different connections of the net. In this case, the shape of the sub-region is determined by combining a geometric analysis (to predict the wiring topology for the net) and delay equations, or by performing series of binary searches (fanning out in different directions from the center). Each such binary search determines a point on the boundary of the allowable placement sub-region. The shape of the sub-region is determined by connecting these points. Initial binary searches are performed horizontally and vertically in the directions where the corners of a diamond lie. Additionally, searches are performed at intermediate directions (e.g., toward the midpoint of a line between two previously determined adjacent boundary points). The process stops when a predetermined maximum number of directions have been searched, or when all new binary searches yield points sufficiently close to the line between the adjacent points, i.e., when the error in the shape without taking into account the most recent binary searches is bound within a certain tolerance.

If a series of binary searches is used to determine the shape of the allowable placement sub-region, it may be more efficient to directly determine the union of sub-regions associated with all of the clock tree leaf element connections in a single series of binary searches rather then separately by computing a sub-region for each connection, and then intersecting them. Alternatively, the loop through steps 240, 250, 260, and 270 in FIG. 2 for the various connections of a net is replaced with a single binary search for all the connections of the net. This process is likely to be more efficient since each step of the binary search includes performing a trial wiring of the net, in view of an often significant overlap between the computations needed to calculate the delays between the net source and its various sinks. In this case, each step of the binary search is typically centered at the original location of the clock tree leaf element or at the centroid (i.e., mean x and y value) of the net connections. The sampling point is moved inward if the delay to any connection is greater than its maximum allowable delay, and is moved outward if the delays to all connections are less than their maximum allowable delays. It is also possible to use a binary search to determine some sub-regions and intersect those regions with other independently determined sub-regions.

Figure 3:
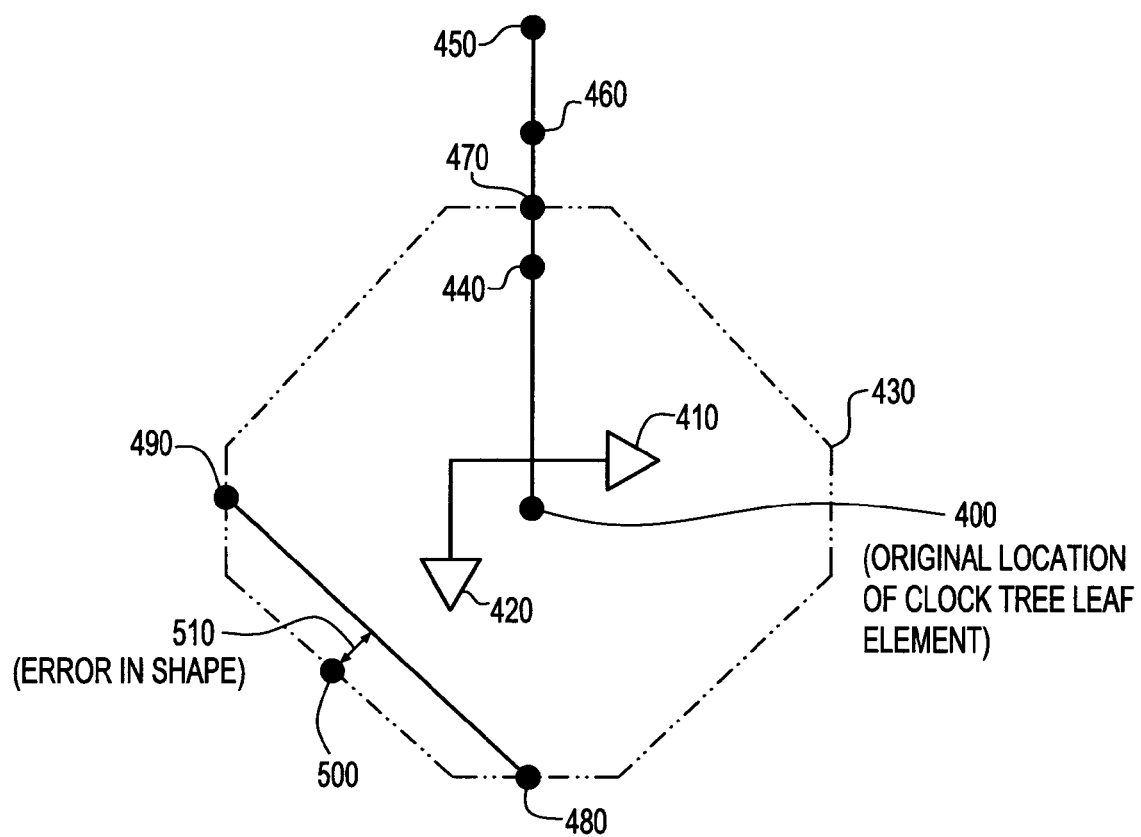
FIG. 3 illustrates the use of a binary search to estimate the shape of an allowable placement region.

FIG. 3 illustrates a binary search to determine the allowable placement sub-region for a net. Point 400 is the original location of the clock tree leaf element whose allowable placement sub-region is determined. Gates 410 and 420 are sinks of the output net of the clock tree leaf element. Shape 430 is the actual allowable placement sub-region that needs to be found, i.e., it is the set of points at which the clock tree leaf element can be positioned such that the delay to one of the net connections equals its maximum allowable delay, and the delay to the other net connection does not exceed its maximum allowable delay.

Let it be assumed that one of the binary searches that determine the allowable placement sub-region shape is directed upward from the original location of the clock tree leaf element. A first exploratory location 440 is attempted, and the delay to each of the connections 410 and 420 is found to be less than its maximum allowable value. As a result, the sampling point is moved outward to a second sample point 450, at which time the delay to at least one of connections 410 and 420 is greater than its maximum allowable value. The sampling point is then moved inward to a third sampling point 460, e.g., between points 440 and 450. As the delay to at least one of connections 410 and 420 is found to be greater than its maximum allowable value, point 460 replaces 450 as the tightest upper bound on the radius in this direction, and a fourth sample point 470 is selected. In this case, the delay to at least one of connections 410 and 420 is found to be sufficiently close to its maximum allowable value; and the other delay is found not to exceed the maximum allowable delay. Accordingly, point 470 is determined to be on the boundary of the allowable placement sub-region. Now, let it be assumed that points 480 and 490 have been determined to be on the boundary of the allowable placement sub-region using a similar binary search. A new binary search is then performed in an intermediate direction toward point 500. Assuming point 500 is found in a similar manner to be on the boundary of the allowable placement sub-region. The error 510 in the shape occurring without having determined boundary point 500 is then computed. If this value is less than some predetermined tolerance, no additional intermediate directions between points 480 and 490 need to be searched.

In determining the shape of the placement sub-region, other constraints related to the distance between the clock tree leaf element and its connections may also have to be met. These include the capacitance and slew (signal rise/fall time) limits. In the event where a binary search is used, a sample point will also be moved inward if any such limit is exceeded.

Figure 4:
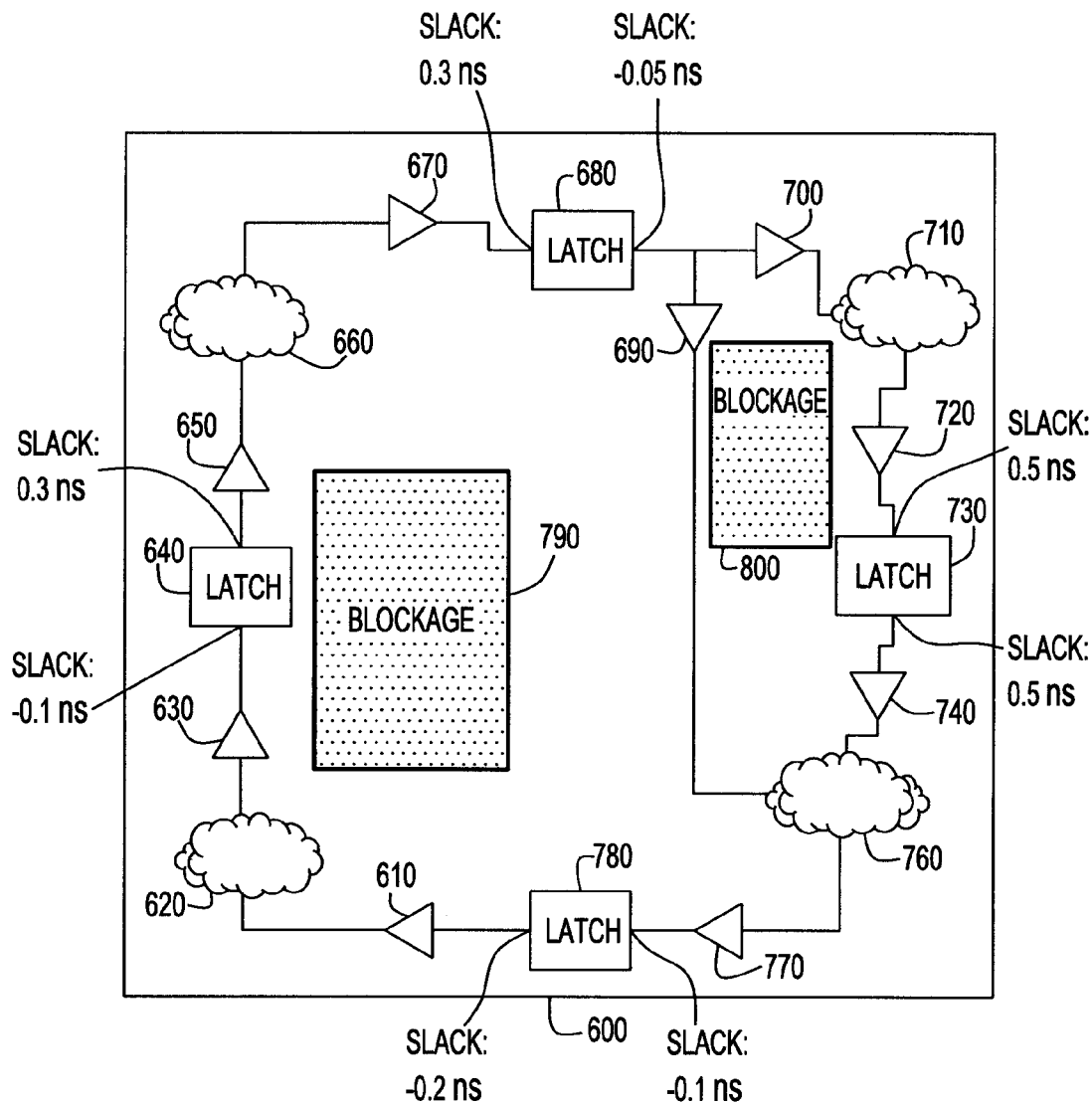
FIG. 4 is an example of a chip to which the method of the present invention is applied.

FIG. 4 illustrates a sample chip 600 for which allowable placement regions for the clocked elements are determined. Therein, latches 780, 640, 680, and 730 are the clock tree leaf elements. Clouds 620, 660, 710, and 760 are combinational logic networks, each of which consists of a set of logic gates devoid of storage elements. Triangles 610, 630, 650, 670, 690, 700, 720, 740, and 770 are combinational logic gates, representing specific gates which have direct connections to the latches and which are placed at the specific locations indicated. Although triangles are often used to represent buffers, in the present instance, there may also exists other logic gates (e.g., AND, OR, NAND, and the like) having other inputs (not shown). Note that these gates are segregated from the cloud of combinational logic. In order to determine the placement regions of the clocked elements it is necessary to know the specific positions of cells driving (or driven by) the clocked elements. Since each of these gates has a single pin that forms a connection to a clock tree leaf element, a reference to these gates should, without ambiguity, be considered equivalent to references to their respective pins which are connected to clock tree leaf elements. The lines represent nets connecting the various logic gates and clocked elements. Clock nets are not shown. Blockages 790 and 800 are the areas occupied by large circuits or other elements which are fixed in location and in which latches may not be placed.

Applying the inventive method of FIG. 2 to the chip shown in FIG. 4, the process starts at step 210 wherein it is determined that there exists clock tree leaf elements (latches 780, 640, 680, and 730) for which placement regions have not yet been established. In step 220, latch 640 is selected from among those without assigned placement regions. In step 230, an initial placement region is assigned encompassing the entire area of chip 600. In step 240, it is determined that latch 640 has two connections to gates 630 and 650 for which placement sub-regions have not yet been determined. In step 250, the input connection to gate 630 is selected having a slack of −0.1 ns. Since this slack is already negative, in order to prevent it from degrading the slack any further, the sub-region for this connection will be a diamond centered at the location of gate 630, with a radius equal to the original distance between gate 630 and latch 640. Alternatively, one may attempt to find a reduced size shape resulting in a positive slack. However, a clock tree leaf element with multiple connections may then end up with disjoint placement sub-regions, leaving a null allowable placement region. For this reason, it is preferable to ensure that the original location of a clock tree leaf element remains in its allowable placement region and, therefore, in all the sub-regions which are intersected to form an allowable placement region. Alternatively, allowable placement sub-regions for negative slack connections may contain only the region in which the clock tree leaf element may be placed to achieve a zero slack. If no such region exists because even a zero length wire to the connection causes a negative slack, a sub-region of minimum size (the size of the clock tree element) immediately adjacent to the connection should be used. In this case, the intersection of the sub-regions should preferably be deferred until all the sub-regions for the clock tree leaf element are computed. If their intersection is empty, all sub-regions which do not include the original placement location of the clock tree leaf element will increase in size until a non-empty intersection is produced.

Figure 5:
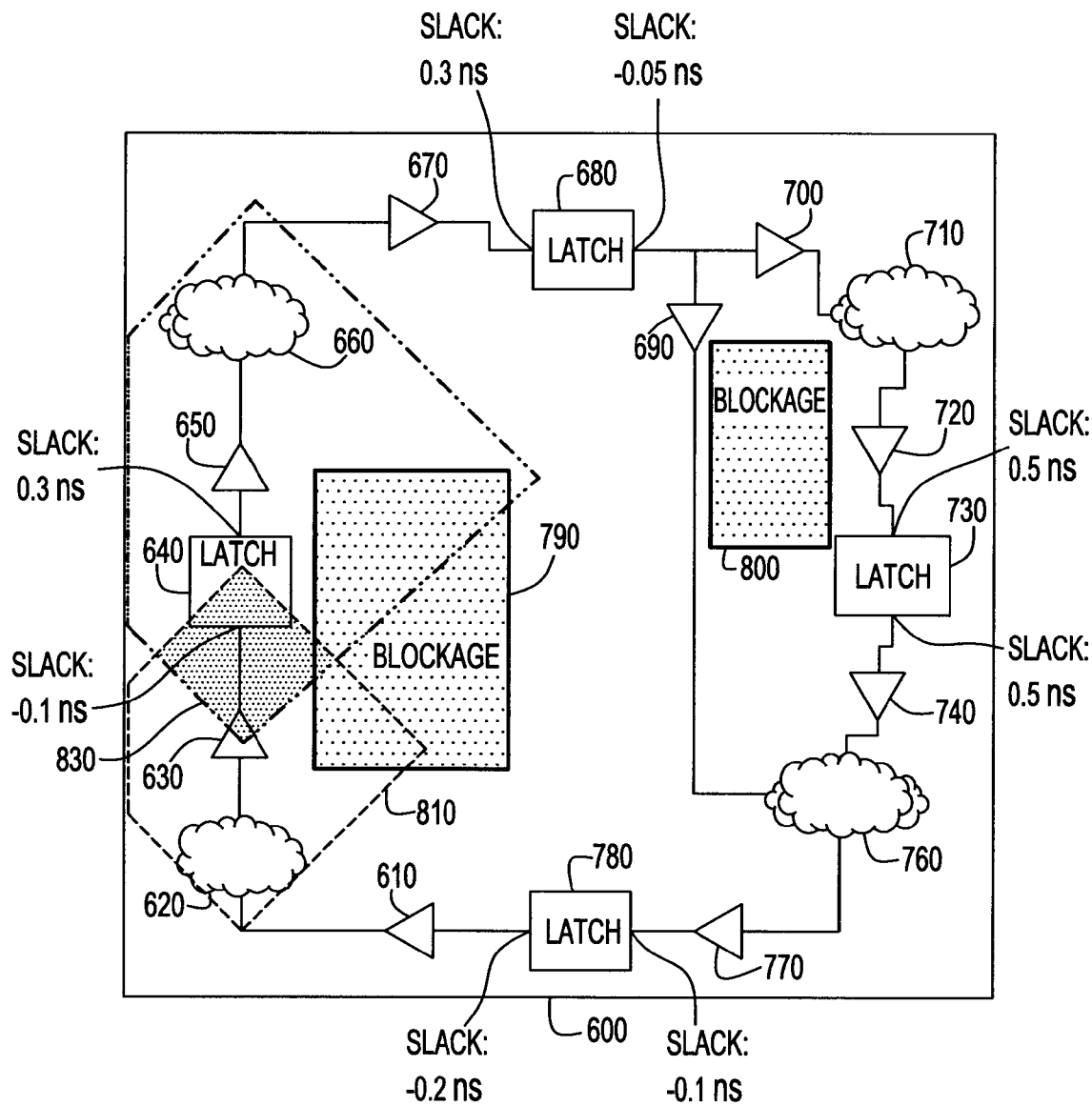
FIG. 5 shows the allowable placement sub-regions for latch 640 of FIG. 4.

Referring to FIG. 5, the allowable placement region 810 for latch 640 with respect to its connection to gate 630 is shown to be projected on chip 600. As described previously, it has a diamond shape (truncated by the edges of the chip) centered at the location of gate 630 (or more precisely, at the location of its output pin which drives latch 640). Continuing with step 270 of FIG. 2, the sub-region 810 is intersected with the initial allowable placement region which encompasses the entire chip 600. Since sub-region 810 was generated such that it does not extend beyond the edges of chip 600, this intersection simply replaces the initial placement region with sub-region 810.

The algorithm now branches to step 240, wherein it is determined that at least one connection of latch 640 exists for which an allowable placement sub-region has not yet been determined. From there, the method proceeds to step 250 in which gate 650 (i.e., which is the remaining connection of latch 640) is selected. Continuing with step 260, placement sub-region 820 for the connection of the output of latch 640 to the input of gate 650 is determined. This connection has a positive slack of 0.3 ns. For explanatory purposes, it is assumed that the wire delay from latch 640 to gate 650 is added to the portion of the internal delay of latch 640 due to its output wire load equals 0.05 ns, when the latch is at its original position. The maximum allowable delay is then 0.05 ns+½ (0.3) ns=0.2 ns. The allowable placement sub-region for this connection will therefore be a diamond 820 centered at the input of gate 650 and whose boundary is the set of locations at which latch 640 can be placed such that the delay from latch 640 to gate 650 equals 0.2 ns. Again, sub-region 820 is created to be positioned completely within the boundaries of chip 600. Proceeding to step 270, sub-region 820 is intersected with the current allowable placement region for latch 640, which is the previously calculated intersection of diamond 810 with the specified area of chip 600. The resulting shaded allowable placement region is 830, and is again diamond shaped. Practitioners of the art will readily recognize that the allowed placement sub-regions computed above for connections of latch 640 to gates 630 and 650 assume that gates 630 and 650 are at fixed locations and are not able to be moved or repowered. If either of these were to occur, the shapes would be larger.

Still referring to the flowchart of FIG. 2, the process now branches to step 240 and finds that no connections of latch 640 remain for which placement sub-regions have not yet been determined. Accordingly, the process proceeds to step 280. However, it is to be understood that the operations of steps 280, 290, and 295 may instead be performed on the allowable placement regions of all clock tree leaf elements following the application of the loop of steps 240, 250, 260, and 270 to all the clock tree leaf elements. Indeed, other orderings of these operations are possible. The selected ordering of FIG. 2 was chosen for ease of understanding. In particular, step 280 that generates a list of congested regions is typically performed only once rather than for each clock tree leaf element of the design, since congested regions are not limited to only a particular clock tree leaf element. Thus, the description of steps 280, 290, and 295 will be deferred until after the application of the loop of steps 240, 250, 260, and 270 to other clock tree leaf elements of chip 600 has been described.

Figure 6:
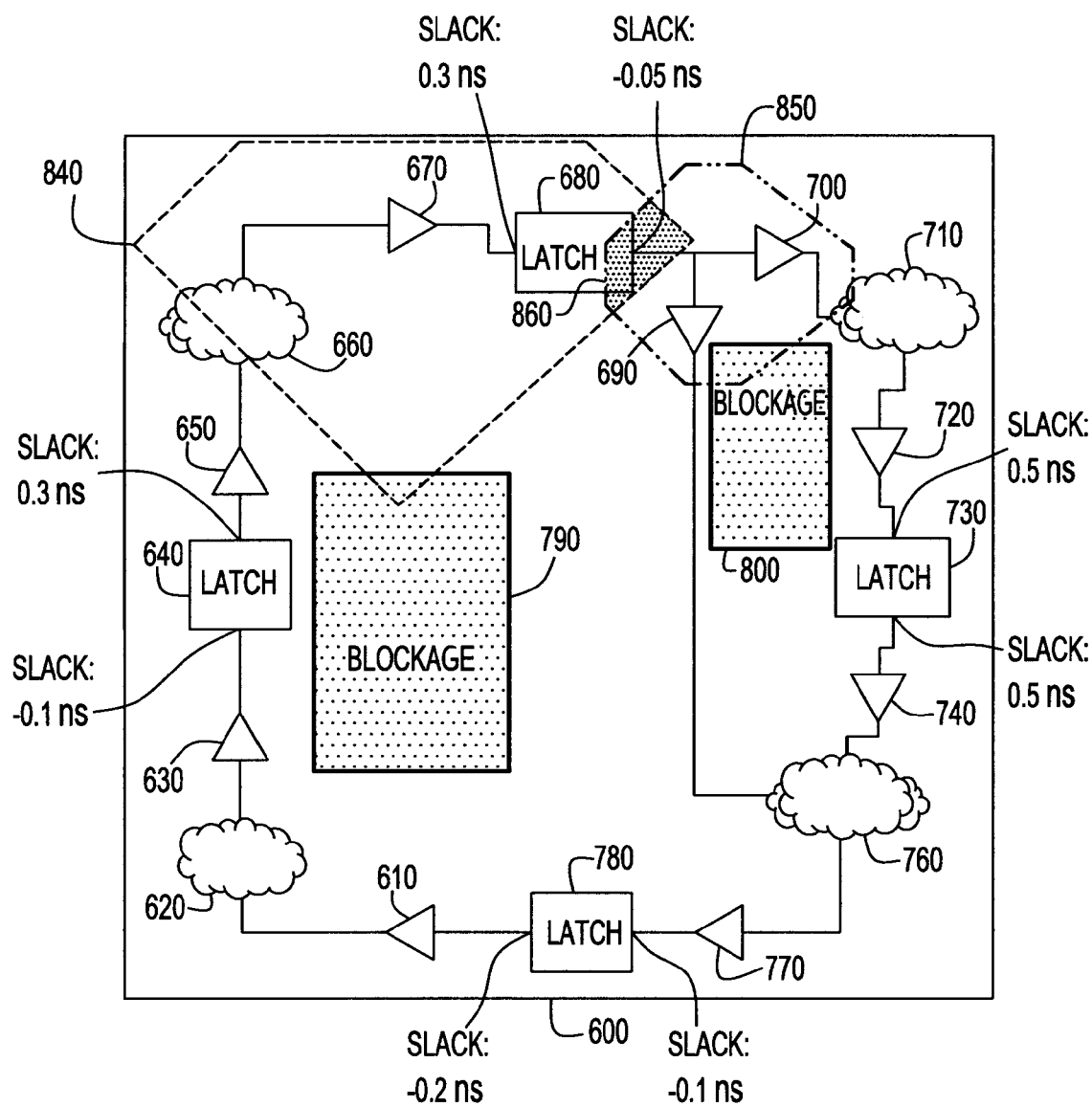
FIG. 6 shows the allowable placement sub-regions for latch 680 of FIG. 4.

FIG. 6 shows two placement sub-regions 840 and 850 for latch 680 corresponding to constraints imposed on the latch by connections of its input and output nets, respectively. Note that region 850 is not diamond shaped because its output drives multiple cells (690 and 700), i.e., it has a fan-out greater than one. Since the net is provided with more than two pins, wiring the net is the factor that defines the shape of the region and the shape of the placement region which is then determined using a binary search, as described previously. The slack of the output net is negative, so that the maximum allowable delay for the output net equals the original delay of that net, and the original location of the latch becomes a point on the boundary of its allowable sub-region. The input slack is positive; therefore, the placement sub-region associated with the connection of latch 680 to gate 670 allows it to move some distance further from gate 670 until the delay from gate 670 to latch 680 increases by 0.15 ns (half the slack) over its original value. The intersection of the two placement sub-regions is shown as shaded sub-region 860.

Figure 7:
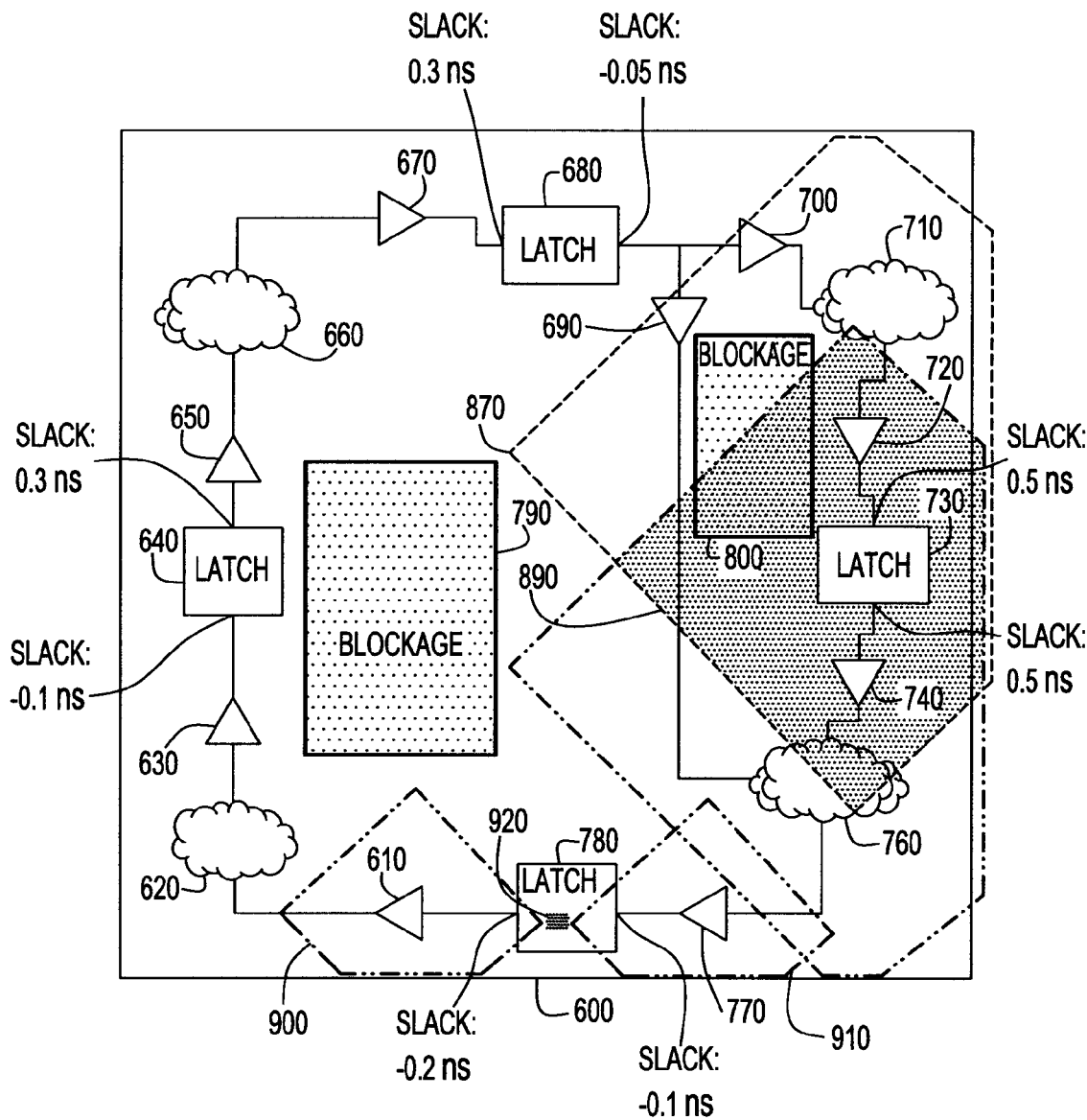
FIG. 7 shows the allowable placement sub-regions for latches 730 and 780 of FIG. 4.

FIG. 7 shows the allowable placement sub-regions for latches 730 and 780 (the remaining two latches of chip 600) based on the constraints imposed by the connections of their input and output nets. Latch 730 has a large positive slack on both its input and output pins; it is therefore assigned a larger allowable placement sub-region, allowing it to move in different directions from its original position. The allowable placement sub-regions for the input and output connections of latch 730 to gates 720 and 740 are 870 and 880, respectively, and their intersection is the shaded sub-region 890. In contrast, both the input and output slacks of latch 780 are negative. Thus, the placement of sub-regions 910 and 900 associated with its connections to gates 770 and 610, respectively, intersect at a single point (the current location of latch 780), and latch 780 allowable placement region 920 is a single point, preventing latch 780 from moving. This illustrates the need for retaining the current location of a clock tree leaf element in its allowable placement region. If this were not done and the allowable placement regions for connections of latch 780 to gates 770 and 610 were made sufficiently small to ensure that the corresponding slacks become positive, their intersection would be empty and there would be no allowable placement location for latch 780.

Returning to the flowchart of FIG. 2, the process continues with step 280. As stated previously, generating a list of congested regions is advantageously performed only once and is reused to compute the allowable placement regions for all the clock tree leaf elements on the chip. The objective of computing the list of regions is to ensure that no clock tree leaf element is placed in any region which becomes overly congested as a result.

Figure 8:
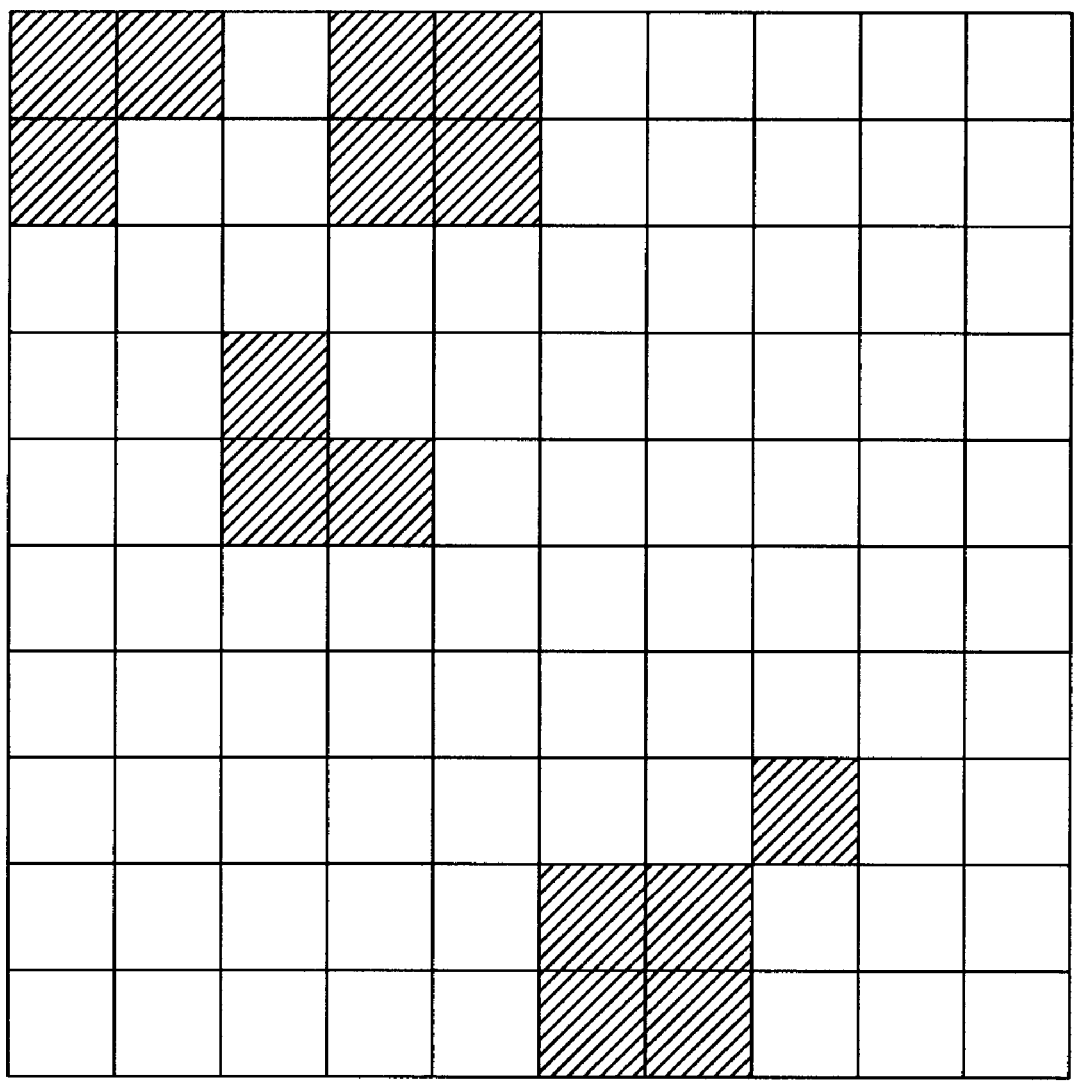
FIG. 8 shows a placement congestion map for the chip of FIG. 4.

FIG. 8 shows a congestion map of chip 600. The total area of the chip is divided into regions (also referred to as bins). The bins that are considered congested are represented by shaded areas. Congestion is determined by detecting when a predetermined percentage of the bin area occupied by circuits exceeds a threshold, the available wiring resource passing through the bin in some direction (e.g., vertical or horizontal) exceeds a certain threshold, the power consumed by the bin exceeds a threshold, or any combination thereof. In step 290, the congestion map further reduces the allowable placement area by subtracting the congested bins from each clock tree leaf element allowable placement region. Subtraction refers to the process of removing from an allowable placement region any portions of congested bins that intersect it. A bin is considered congested if some specified fraction of its area is occupied, or if the wiring resource used within the bin exceeds some specified fraction of the available wiring resources of the bin, or if its power capacity utilized exceeds some specified limit. However, such a definition leads to an entire allowable placement region for the clock tree leaf element deemed to be congested, resulting in an empty allowable placement region after the congested bins are subtracted therefrom. Thus, it is preferable to consider a separate congestion limit when determining the congested bins to be subtracted from each clock tree leaf element allowable placement region. Any bin is considered congested if its congestion (percentage of area, wiring resource, or power capacity used) exceeds some specified limit and is greater than the corresponding measure for the bin in which a clock tree leaf element was originally placed. As a result, the original location of the clock tree leaf element will never be considered congested, and will always remain in the allowable placement region for that clock tree leaf element. In this case, the congestion map of FIG. 8 will not merely have a binary classification of whether bins are congested or not, but will instead record the degree of congestion in each bin. Separate congestions maps are advantageously maintained and used for area congestion, wiring congestion, and power congestion. Further, separate congestion maps are utilized for wiring in different directions or on different wiring layers.

Figure 9:
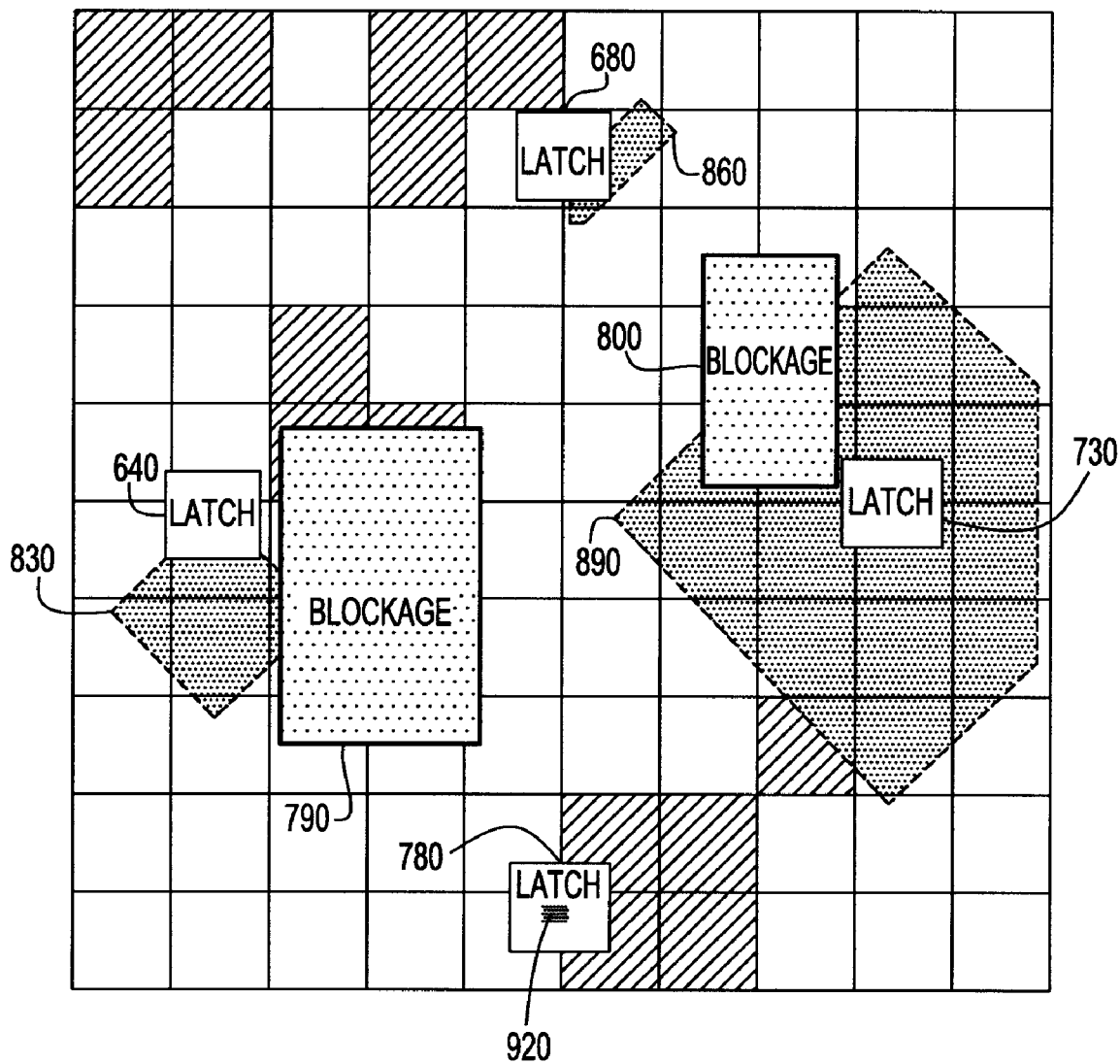
FIG. 9 shows the allowable placement regions for the latches of FIG. 4 overlaid with blockage and congestion maps.

FIG. 9 shows the allowable placement regions for each of the latches illustrated in FIG. 4 based on timing constraints of their connections superimposed onto the congestion map of FIG. 8 along with blockages 790 and 800. In steps 290 and 295 of FIG. 2, portions of each of the allowable placement regions which overlap a blockage shape or having a congested bin are removed from the allowable placement regions.

Figure 10:
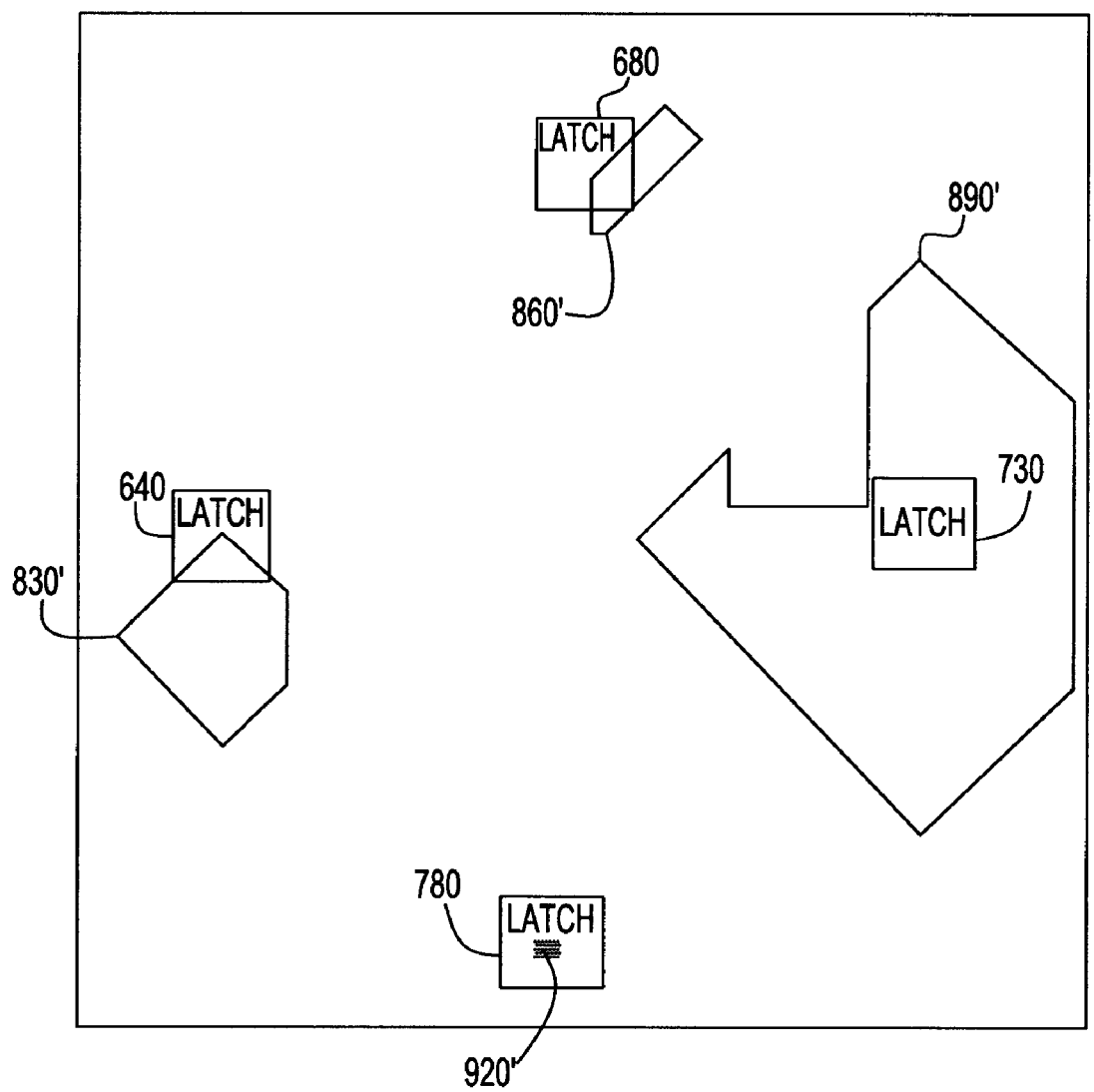
FIG. 10 shows the final allowable placement regions for the latches of FIG. 4.

FIG. 10 shows the final allowable placement regions 830', 860', 890', and 920' for the latches of FIG. 4 after having the overlaps with congested bins and blockages subtracted.

Once the allowable placement regions for all of the clocked elements have been determined, the method of FIG. 2 proceeds with step 300 to construct the leaf level of the clock tree. The process begins by building clusters of the clock tree leaf elements, each of which is driven by a single clock net or set of clock nets. An instance of a situation is found when the clock tree leaf elements of the cluster are driven by a set of clock nets consisting of a design in which each latch is fed by a separate master and slave clock signal. In that case, a single master clock net feeds all the latches of the cluster, and a single slave clock net also drives the same set of clustered latches. The master and slave clock nets form the set of clock nets driving the cluster. A variety of techniques are used to construct these clusters which can be optimized by minimizing a variety of cost functions. (Note: a cost function assigns a value to a cluster of nets based on certain criteria). The cost function typically includes capacitance minimization, delay minimization, capacitance balancing, fan-out balancing, delay balancing, and any combination thereof. The clustering method is also required to satisfy one or more constraints such as capacitance limits, fan-out limits, slew limits, delay limits, and the like.

A method of using a cost function to cluster clock tree leaf elements is described in U.S. Pat. No. 5,963,728 to Hathaway et al., of common assignee, which describes a method of converting a variety of trial partitionings of clocked elements into clusters. It chooses a partitioning that does not violate any of the limits imposed (or which has the smallest violation of those limits). Among such partitionings, it selects the one having the smallest cumulative cost function. Other methods, such as the well-known optimization techniques of simulated annealing, may also be used. The current invention extends prior art methods by determining whether any limit violations exist and evaluates the cost function assuming that all the clock tree leaf elements in a cluster are moved to the points within their respective allowable placement region which avoid or minimize any limit violations and which minimizes the cost function. Several methods are used to determine the points to which the clock tree leaf elements within the cluster are to be moved. By way of example, one method first finds the center of each allowable placement region (i.e., for an allowable placement region whose bounding box extends from xmin to xmax and from ymin to ymax, the point whose coordinates are ½(xmin+xmax) and ½(ymin+ymax)). Once center points (x1, y1) to (xN, yN) have been determined for the allowable placement regions of the N clock tree leaf elements in the cluster, the centroid of these points is found (e.g., the point with coordinates (x1+ . . . xN)/N and (y1+ . . . yN)/N). Each clock tree leaf element is then placed at a point within its allowable placement region which is closest to the centroid. Another method first places each clock tree leaf element at an arbitrary location within its allowable placement region (e.g., its original location). The clock tree leaf elements are then moved one by one to an optimal point within their allowable placement region with respect to the current locations of the other clock tree leaf elements. One way of determining the optimal position is to choose a point for which the x coordinates is closest to the median x coordinate of all other clock tree leaf elements and for which the y coordinate is closest to the median y coordinate of all other clock tree leaf elements. In the event where moving one of the coordinates closer to the median forces the other to be farther from the median, then the clock tree leaf element is moved to a point that minimizes the sum of the differences of the x and y coordinates from the medians. It will be understood that other methods may be advantageously used to move the clock tree leaf elements within their respective allowable placement regions.

Returning to the example of FIG. 4, let it be assumed for simplicity that clusters of size two are to be created (e.g., because of fan-out limitation).

Figure 11:
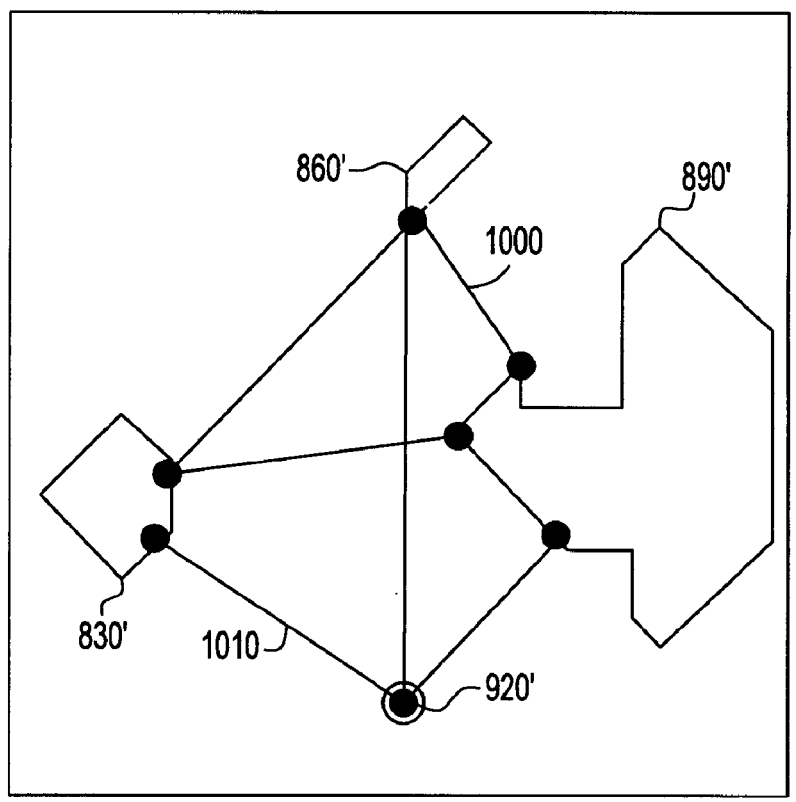
FIG. 11 shows all of the possible pair-wise clustering of the latches of FIG. 4.

FIG. 11 illustrates all possible clusters of two clock tree leaf elements. Each potential cluster is represented by a line between the closest points within the allowable placement regions of the latches included in the cluster. Thus, line 1000 between allowable placement regions 860' and 890' represents a cluster of latches 680 and 730 to which these allowable placement regions belong. Similarly, line 1010 between allowable placement regions 830' and 920' represents a cluster of latches 640 and 780, to which the allowable placement regions belong. Note that different lines attached to a single allowable placement region will make contact with that region at different points since the latch to which the allowable placement region belongs will move to different locations therein for different clusterings. Note also that all the lines contacting allowable placement region 920' go to the same point since latch 780 to which it belongs, was not allowed to be moved.

Step 310 of FIG. 2 clusters the clock tree leaf elements. In the example of FIG. 4, it is assumed that the cost function to be minimized is the sum of the distances between the latches of all clusters. This results in clustering latch 680 with latch 730, and latch 780 with latch 640, because the sum of the lengths of lines 1000 and 1010 is smaller than the sum of any other two compatible lines representing other clusters. Compatible in this context requires that two lines connected to a single allowable placement area not to be selected, since this implies that the latch to which the allowable placement region belongs is to be clustered with two other latches. In the present example, each cluster is constrained to having only two latches.

In step 320 of FIG. 2, latches are moved to locations represented by solid dots (see FIG. 12), bringing the latches of each cluster in close proximity of each other. These locations are consistent with those assumed in FIG. 11 for the trial clusters that were used to evaluate the cost function of the trial clustering.

Figure 12:
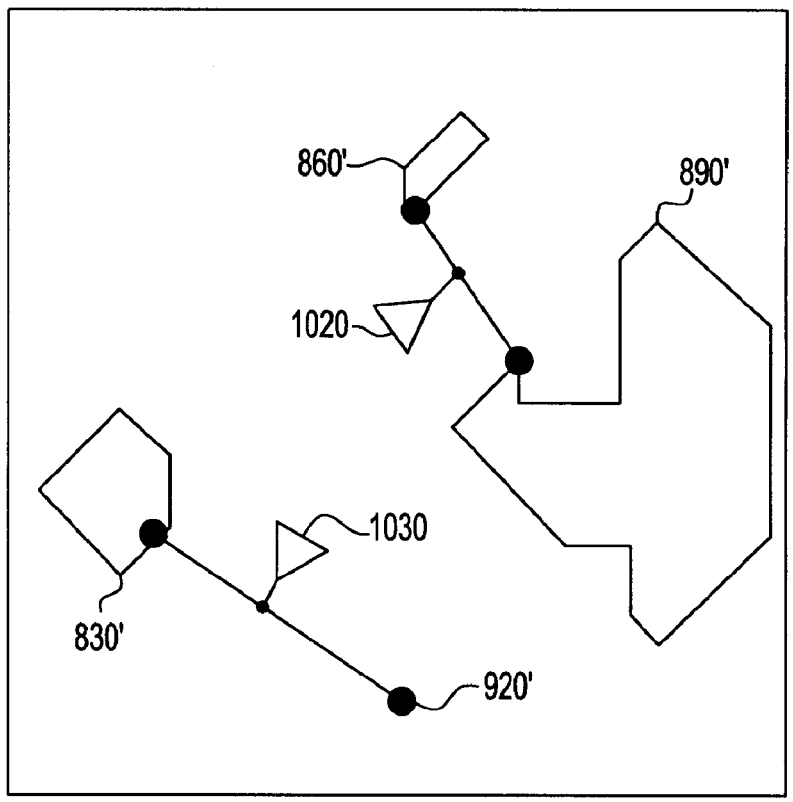
FIG. 12 shows the final pair-wise clustering of the latches in FIG. 4, chosen to provide a minimum wire length.

Finally, in step 330 of FIG. 2 clock buffers 1020 and 1030 are positioned to drive the clusters, as shown in FIG. 12. The placement of buffers is performed in a way that minimizes the cost function, a typical cost function component being the maximum RC delay from clock buffer to any of the clocked elements it drives. This results in the clock buffers being placed at the centroid of the clock tree elements of the cluster being driven. Alternatively, the placement of the clock tree buffers may be deferred and allowable placement regions generated for each clock buffer, within which the clock buffer is to be placed without violating any limit constraints. Step 300 of the inventive method is then applied to a set of clock buffers to determine clustering and placement of clock buffers driving the clock buffers. Since the location of the clock buffer driving a net also affects the optimal placement of the clocked elements it drives, the final placement of the clock tree leaf elements is, preferably, deferred. In this case, determination of allowable placement regions and clustering is performed first on the clock tree leaf elements and then at successive levels of the clock buffers, all the way to the root of the clock tree. The final placement locations are then determined by starting at the clock tree root. At each level the location within the allowable placement region of a clocked element which minimizes the cost function is chosen and the clocked element is fixed at that location. This is repeated at each level of the clock tree from the root to the leaves to determine the final placement of all the clocked elements in the clock tree. Although the final placement of the clock buffers driving clock tree leaf elements may be deferred as described above, in many cases it is desirable not to do so, but rather placing them at the centroid of the set of clock tree leaf elements they drive. The reason for this is that the clock buffers (those directly driving the clock tree leaf elements) may be clock splitters which have a single clock input and two clock outputs (master and slave clock). In this case, an increase in distance between the clock splitter to the clock tree leaf elements requires twice as much wire (and hence, twice as much capacitive load and resultant switching power) as the increase in distance between the clock splitter and the clock buffer driving it. Another reason is that the last clock driving elements in the clock tree may be pulse generators, and such elements impose severe restrictions on the RC delay (and hence length) of the nets they drive to ensure that well-formed pulses are delivered to the clocked elements.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of generating a clock distribution network on an integrated circuit comprising steps of:
   determining an allowable placement region for each of at least one clock tree leaf element;
   grouping said at least one clock tree leaf element into at least one cluster; and
   placing said at least one clock tree leaf element at a location within said allowable placement region wherein a cost function is minimized, and wherein said allowable placement region is formed by intersecting a plurality of sub-regions.

2. The method as recited in claim 1, wherein at least one of said sub-regions that generates an allowable placement region for a given clock tree leaf element is determined based on a slack of a connection of said given clock tree leaf element.

3. The method as recited in claim 2, wherein said at least one of said plurality of sub-regions is generated using a binary search.

4. The method of claim 2, wherein said at least one sub-region is determined based on the slack of said connection of said given clock tree leaf element including only locations at which said given clock tree leaf element can be placed without reducing said slack by more than a computed allowable slack reduction value.

5. The method of claim 4, wherein said computed allowable slack reduction value is one-half of said slack.

6. The method of claim 4, wherein allowable slack reduction values are computed for a plurality of clock tree leaf element connections in an order that is determined by slacks of said plurality of clock tree leaf element connections.

7. The method as recited in claim 1, wherein at least one of said plurality of sub-regions that generates an allowable placement region for a given clock tree leaf element is based on at least one congestion value.

8. The method as recited in claim 7, wherein said at least congestion value is selected from a group consisting of a placement congestion value, a wiring congestion value, a power congestion value, and any combination thereof.

9. The method as recited in claim 1, further comprising determining final placement locations for a plurality of sinks in a clock distribution network of an integrated circuit chip, comprising steps of:
   a) starting at a root net of a clock tree, determining a final placement location within an allowable placement region for at least one element of a first level of said plurality of sinks coupled to said root net while minimizing a cost function;
   b) selecting at least one element of a second level of said plurality of sinks coupled to said at least one element of said first level of sinks, and determining for said at least one element of said second level of sinks a final placement location within its allowable placement region while minimizing the cost function; and
   c) repeating step b) for elements of subsequent levels of sinks until a last level of sinks is reached.

10. The method of claim 9 further comprising a step of: placing the elements of the last level of sinks at positions within their allowable placement regions to minimize the total wire length between the elements of the last level of sinks.

11. The method of claim 10 wherein said elements of said last level of sinks are latches.

12. The method as recited in claim 1 further comprising the step of removing blockages from said allowable placement regions.

13. The method as recited in claim 12, wherein said removing blockages from said allowable placement regions comprises steps of:
   identifying blockages which are respectively superimposed on allowable placement regions; and
   redefining said respective superimposed allowable placement regions as said allowable placement regions from which their respective superimposed blockages have been subtracted.

14. The method as recited in claim 1 further comprising a step of removing congested regions from said allowable placement regions.

15. The method of claim 1, wherein said clock distribution network includes at least one first clocked element driving at least one second clocked element, and wherein said method further comprises steps of:
   d) determining allowable placement regions for each of said at least one first clocked elements and said at least one second clocked elements;
   e) assigning a final placement location for said at least one first clocked element within said allowable placement region of said at least one first clocked element; and
   f) assigning a final placement location for said at least one second clocked element within said allowable placement region of said at least second clocked element, wherein said final placement location of said at least one second clocked element is based on said final placement location of said least one first clocked element.

16. The method of claim 1, wherein said allowable placement region for said at least one clock tree leaf element includes an initial placement location of said at least one clock tree leaf element.

17. The method as recited in claim 1, wherein said grouping said at least one clock tree leaf elements into at least one cluster is based on allowed placement regions of said clock tree leaf elements.

18. The method as recited in claim 17, wherein each of said at least one cluster is driven by a respective clock net, and each clock tree leaf element that has been clustered is moved to a point of its allowed placement region that minimizes an amount of wire for said respective clock net, thereby reducing power consumption.

19. A method of generating allowable placement regions in a clock distribution network of an integrated circuit (IC) chip comprising steps of:
   a) allocating the entire area of the IC chip to an allowable placement region of at least one clock tree leaf element having at least one non-clock port;
   b) determining a sub-region associated with at least one of said at least one non-clock port of said at least one clock tree leaf element;
   c) redefining said allowable placement region to be an intersection of said allowable placement region with said sub-region;
   d) generating a list of congested regions and subtracting congested regions from said allowable placement region; and
   e) generating a list of blockage regions and subtracting blockage regions from said allowable placement region.

20. The method as recited in claim 19, wherein each of said intersected sub-regions is related to a constraint on a clocked element.

21. The method as recited in claim 20, wherein intersecting said allowable placement region comprises steps of:
   a) forming a region for each connection of said clocked element within which timing requirements between said clocked element and its connection are satisfied and, if they cannot be satisfied, within which they are not worsened; and
   b) forming a region that avoids placing said clocked element at a location that causes local circuit or wiring density requirements to exceed a predetermined limit.

22. The method as recited in claim 21, wherein in step a) at least one of said regions is shaped as a diamond having 90° angles, and wherein all points on said diamond are equidistant from a center of a Manhattan space.

23. The method as recited in claim 21 wherein in step b) said region has an arbitrary shapes.

24. A program storage device readable by a machine, tangibly embodying a program of instructions executable by the machine to perform method steps for generating a clock distribution network on an integrated circuit, said method steps comprising:
   determining an allowable placement region for each of at least one clock tree leaf element;
   grouping said at least one clock tree leaf element into at least one cluster; and
   placing said at least one clock tree leaf element at a location within said allowable placement region wherein a cost function is minimized, and wherein said allowable placement region is formed by intersecting a plurality of sub-regions.

* * * * *